United States Patent
Watanabe et al.

[11] Patent Number: 5,561,372
[45] Date of Patent: Oct. 1, 1996

[54] CONNECTOR INSERTION INSPECTION JIG

[75] Inventors: Tamio Watanabe; Shizuo Suzuki, both of Shizuoka, Japan

[73] Assignee: Yazaki Corporation, Tokyo, Japan

[21] Appl. No.: 401,228

[22] Filed: Mar. 9, 1995

[30]     Foreign Application Priority Data

Mar. 9, 1994  [JP]  Japan .................................. 6-038492

[51] Int. Cl.⁶ .............................. G01R 31/02; G01R 31/04
[52] U.S. Cl. ........................................ 324/158.1; 324/508
[58] Field of Search .............................. 324/158.1, 537, 324/538, 754, 508, 555, 556; 439/310, 489, 490; 340/656

[56]              References Cited

U.S. PATENT DOCUMENTS

| 4,658,212 | 4/1987 | Ozawa et al. ........................... 324/754 |
| 4,902,968 | 2/1990 | Sugimoto ................................ 324/538 |
| 4,959,609 | 9/1990 | Prokopp et al. ........................ 324/537 |
| 5,335,413 | 9/1994 | Yamamoto et al. ..................... 324/538 |
| 5,419,711 | 5/1995 | Noro et al. ........................... 324/158.1 |
| 5,429,519 | 7/1995 | Murakami et al. ...................... 439/310 |
| 5,438,748 | 8/1995 | Matsuzawa .............................. 439/310 |
| 5,455,515 | 10/1995 | Saijo et al. ............................. 324/538 |

FOREIGN PATENT DOCUMENTS

| 58-12874 | 1/1983 | Japan . |
| 64-27668 | 2/1989 | Japan . |
| 6-310200 | 11/1994 | Japan . |

*Primary Examiner*—Ernest F. Karlsen
*Attorney, Agent, or Firm*—Sughrue, Mion, Zinn, Macpeak & Seas

[57]                    ABSTRACT

A connector insertion inspection jig has a frame reception portion for holding a frame of a divided multipolar connector, a detector body facing the frame reception portion and provided so as to be movable forward/backward, and detection pins which are disposed on the detector body so as to be able to elastically contact with respective sub-connectors mounted in the frame. At least a set of the detection pins are provided for each of the sub-connectors so as to project from the detector body toward the front surfaces of the sub-connectors and so as to be separated from each other.

6 Claims, 4 Drawing Sheets

CONNECTOR INSERTION INSPECTION JIG

BACKGROUND OF THE INVENTION

1. Field of the invention

The present invention relates to a connector insertion inspection jig for inspecting the state of installation of a plurality of various sub-connectors into a frame in a divided multipolar connector having the sub-connectors to be installed into the frame.

2. Related art

In interconnecting a number of wire harnesses which are disposed, for example, in a car or the like, a divided multipolar connector has been useful since a plurality of multipolar connectors connected to the respective wire harnesses can be arranged on one frame and connected on one place.

However, there has been no conventional inspection jig which can be applied to a divided multipolar connector to thereby detect any imperfect installation of sub-connections perfectly.

In the method of inspection by human eyes, the difference of projection over the frame between one sub-connector installed perfectly and another installed imperfectly is too small to judge the difference if the two sub-connectors are not adjacent to each other. This method is therefore ineffective in the inspection for mass-produced products.

SUMMARY OF THE INVENTION

Taking the foregoing surroundings into consideration, the present invention has been attained and an object thereof is to provide a connector insertion inspection jig which can always detect the installation of sub-connectors into a frame in a divided multipolar connector accurately, so that troubles such as detachment of the sub-connectors from the frame when the connector is fitted can be prevented.

In order to attain the foregoing object, according to the present invention, in a connector insertion inspection jig for inspecting the state of engagement between a plurality of sub-connectors and a frame in a divided multipolar connector having the sub-connectors fitted and installed into the frame, there are provided a frame reception portion formed at one end portion of a bed so as to fixedly hold the frame of the divided multipolar connector, a detector body facing the frame reception portion so as to be moved forward/backward on the bed by means of rotation of an operating lever, and detection pins which are disposed on the detector body so as to be able to elastically contact with the front surfaces of the respective sub-connectors engaged with the frame when the detector body is moved forward; and at least a set of the detection pins are provided for each of the respective sub-conectors, the detector pins projecting toward the front surface of the sub-connector and being separated from each other.

In the connector insertion inspection jig, preferably, each of the detection pins is provided with a switch means and a spring means coaxially, so that the detection pin is energized forward by the spring means, and the switch means outputs an electric signal when the detection pin is moved backward against the spring means.

In the connector insertion inspection jig, preferably, each of the sub-connectors is provided with engagement projections or flexible engagement pieces (or lances) at opposite positions on their outer walls so that the engagement projections or flexible engagement pieces (or lances) engage with flexible engagement pieces (or lances) or engagement projections provided in the frame when the sub-connector is fitted into the frame, and that the detection pins project correspondingly to symmetric positions with respect to the centers of the front surfaces of the sub-connectors, and are arranged along the engagement projections or flexible engagement pieces (lances) disposed oppositely.

Since a set of detection pins separated from each other are provided so as to be able to come into elastic contact with the front surface of a sub-connector at the time of inspection, the respective switch means of the two detection pins do not output electric signals at least simultaneously in the case of such an imperfect state of a sub-connector that engagement projections or lances are engaged with a frame only on one side, or in the case where the engagement projections or lances are not engaged on either side. It is therefore possible to detect such an imperfect insertion state.

DETAILED DESCRIPTION OF THE PREFERRED EMBODIMENTS

Preferred embodiments of the present invention will be described in detail with reference to the drawings.

First Embodiment

Figure 4:
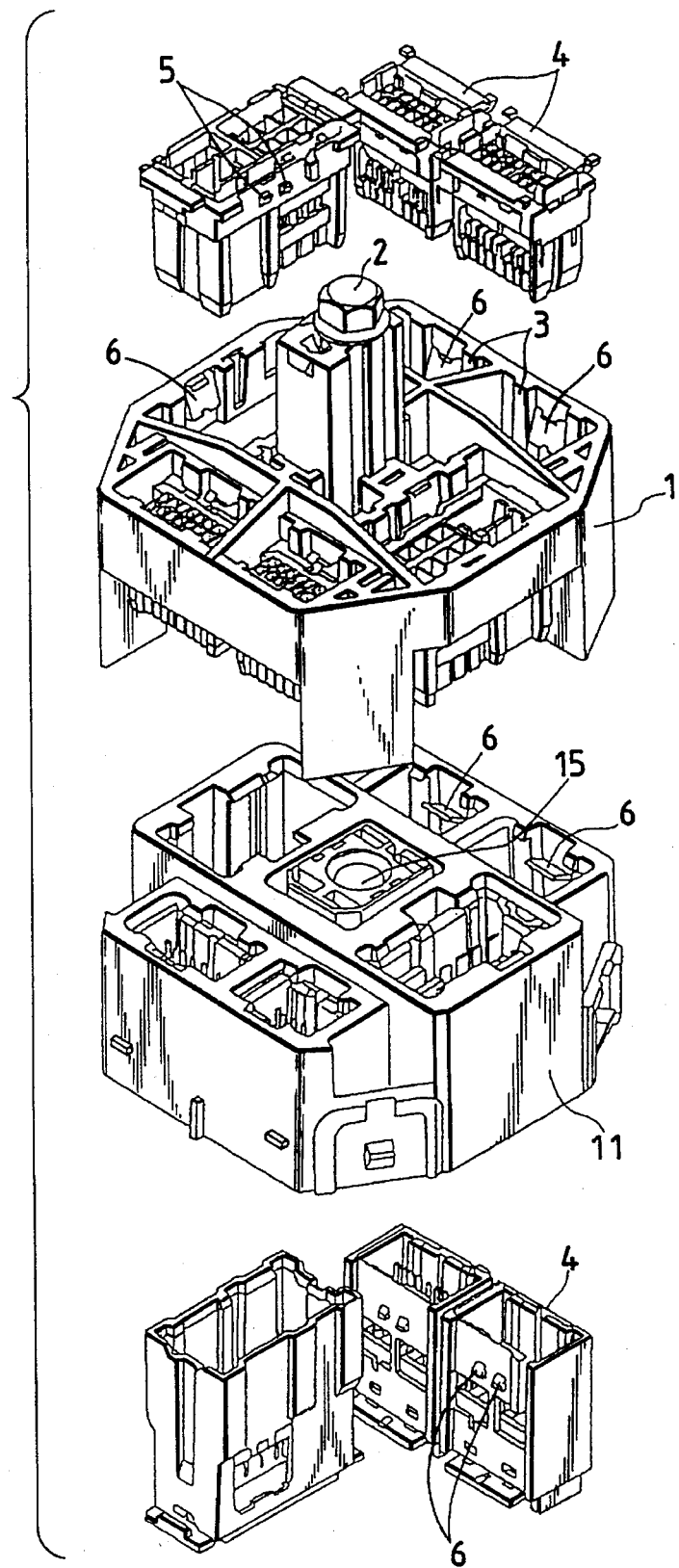
FIG. 4 is an exploded perspective view of the divided multipolar connector.

FIG. 4 shows an example of such a divided multipolar connector. In this divided multipolar connector, a frame 1 has a bolt 2 which is provided in the center of the frame 1 so that the bolt 2 can be screwed down into a bolt hole 15 of a partner-side frame 11. Multipolar connectors 4 are mounted respectively in a plurality of fitting holes 3 provided around the bolt 2. If the bolt 2 is screwed down into the bolt 15 of the partner-side frame 11 having a similar structure, connectors on the two frames 1 and 11 can be connected to each other.

Since a plurality of multipolar connectors could be connected by this divided multipolar connector, the workability of connection could be improved on a large scale in comparison with the case where the connectors were connected to each other individually. Further, since a plurality of multipolar connectors are mounted on one divided multipolar connector, the space occupied by the multipolar connectors can be reduced. In addition, since the multipolar connectors were fitted by screwing a bolt, the connectors could be fitted without any specially large fitting force.

In the divided multipolar connector having such a wide variety of advantages as mentioned above, the individual multipolar connector (hereinafter referred to as "sub-connector") 4 is mounted on the frame 1 in a manner so that the sub-connector 4 is inserted into the fitting hole 3 from the rear end (from the above in the drawing) of the frame 1, and engagement projections 5 of the sub-connector 4 are engaged with flexible engagement pieces (or lances) 6 formed in the fitting hole 3. Consequently, the sub-connector 4 is fixed in the frame 1 so that the sub-connector 4 cannot be detached backward.

Figure 5:
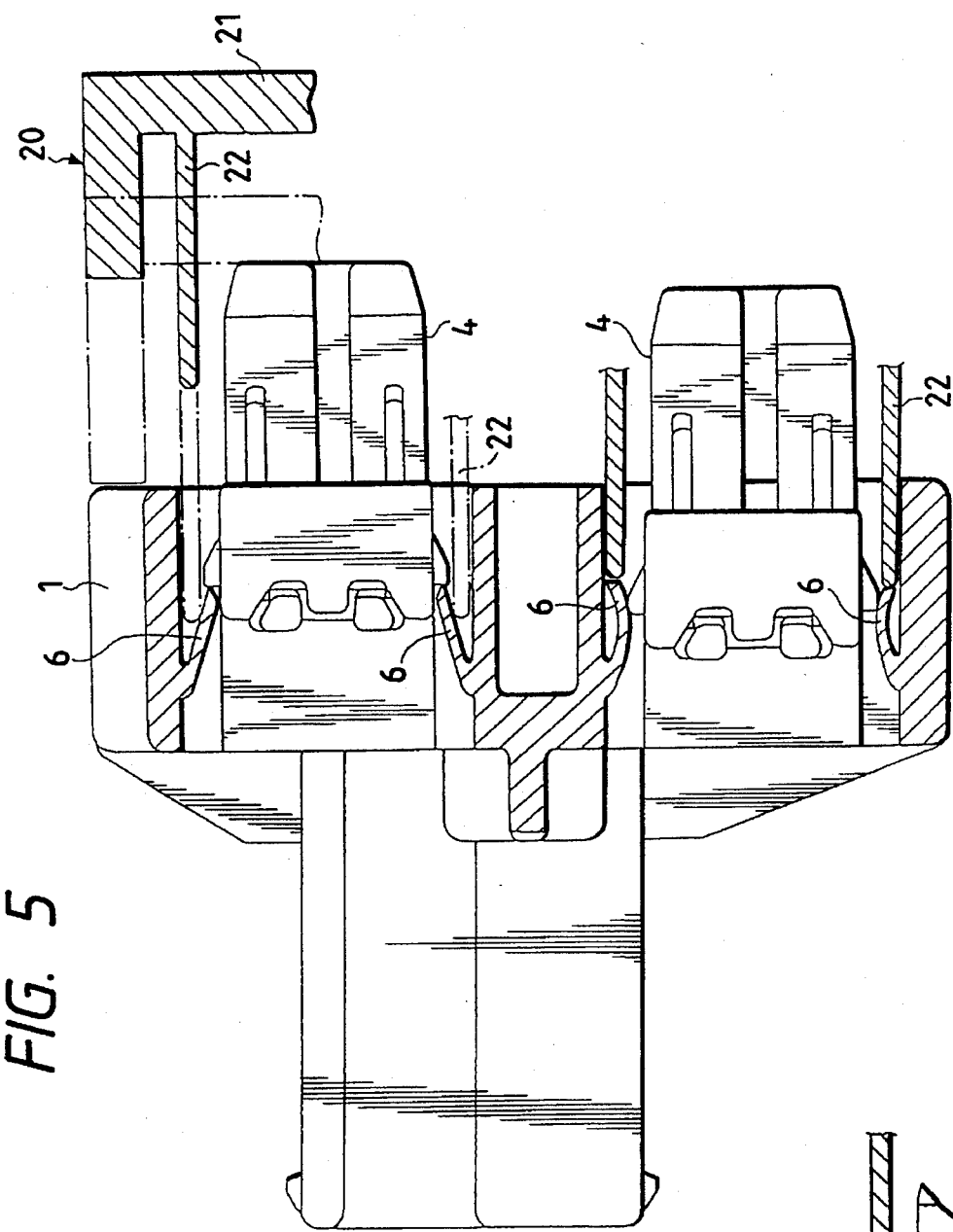
FIG. 5 is a diagram for explaining a first embodiment of the present invention, showing the installation state of sub-connectors.

In the above structure in which the sub-connectors 4 are required to be installed into the frame 1 perfectly, the confirmation of the installation has been traditionally performed by human eyes or by use of such a jig 20 having detection pins 22 projecting from a bottom plate portion 21 as shown in FIG. 5.

In this jig 20, each of the detection pins 22 detects the position of the lance 6 associated therewith. That is, in the case of perfect installation shown in the upper part of the drawing, a gap is formed between the inner wall of the frame 1 and the lance 6 so that the detection pin 22 is inserted by a predetermined quantity and the perfect installation can be thereby detected. On the other hand, in the case of imperfect installation shown in the lower part of the drawing, the lance 6 is left as it is bent, the detection pin 22 collides with the lance 6, and is not inserted by the predetermined quantity. Accordingly, the imperfect installation can be detected well in the same manner.

Second Embodiment

Figure 1:
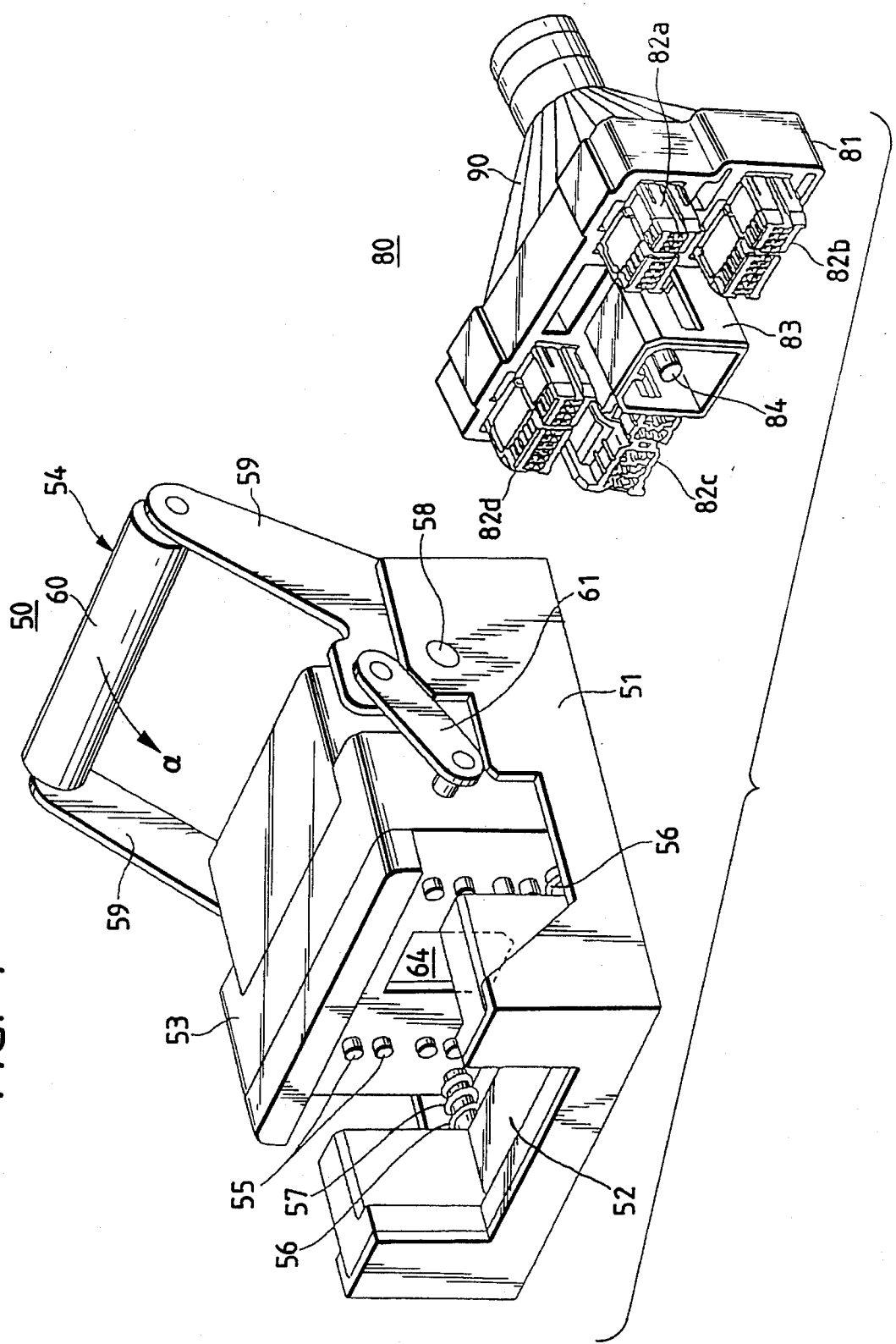
FIG. 1 is a perspective view of a connector insertion inspection jig according to a second embodiment of the present invention, and a divided multipolar connector which is an object to be inspected.
Figure 2A:
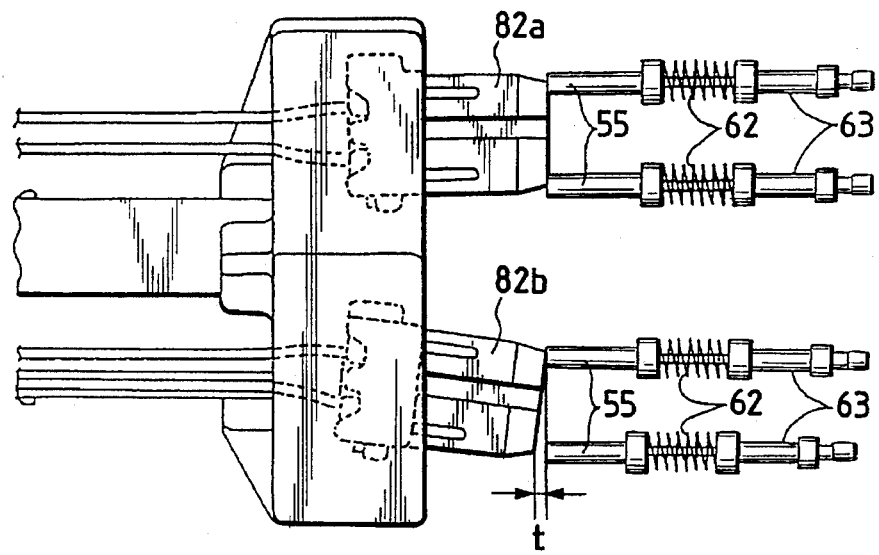
FIGS. 2 (a) and (b) are diagrams for explaining the state of inspection of the connector insertion inspection jig in FIG. 1.
Figure 2B:
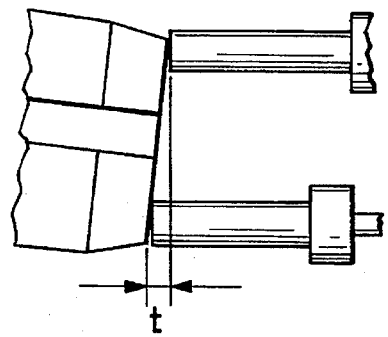
Figure 3:
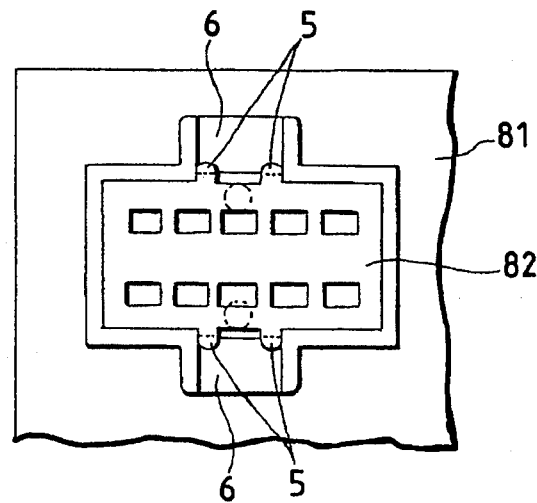
FIG. 3 is a partial front view of the divided multipolar connector showing the contact positions of inspection pins.

FIGS. 1 to 3 show second embodiment of the connector insertion inspection jig according to the present invention.

In FIG. 1, a connector insertion inspection jig 50 according to the present invention is constituted by, as its main portions and members, a bed 51 having an approximately U-shaped section, a frame reception portion 52 formed at one end of the bed 51 so as to fixedly hold a divided multipolar connector 80 which is an object to be inspected, a detector body 53 facing the frame reception portion 52 so as to be moved forward/backward by the rotation of an operating lever which will be described later, and detection pins 55 disposed on the detector body 53 so that the detection pins 55 can be brought into elastic contact with the front surfaces of a plurality of sub-connectors 82a to 82d mounted on a frame 81 of the divided multipolar connector 80 respectively when the detector body 53 is moved forward.

The divided multipolar connector 80 is constituted substantially in the same manner as what is shown in FIG. 4. The sub-connectors 82a to 82d having various multipolar structures and connected to wire harnesses 90 respectively are fitted into fitting holes (refer to FIG. 4) of the frame 81 from the back toward the front so as to be installed thereon. In this embodiment, four male sub-connectors are installed on the frame 81.

Engagement projections 5 are provided at the approximate centers of the upper and lower surfaces, or the opposite walls, of each of the sub-connectors 82a to 82d so as to cooperate with lances 6 formed on the frame 81 side (refer to FIG. 3) to thereby constitute lock means. Thus, each of the sub-connectors 82a to 82d is fixed to the frame 81 by his lock means, that is, through engagement of the engagement projections 5 with the corresponding lances 6.

An angular cylinder portion 83 is formed in the front center portion of the frame 81 so as to project from the frame 81. A bolt 84 is provided in the center of the angular cylinder portion 83 so that the bolt 84 can be screwed down into a nut provided fixedly on a not-shown partner-side frame.

Returning to the structure of the connector insertion inspection jig 50, the frame reception portion 52 can fixedly hold the frame 81 when the assembled divided multipolar connector 80 is fitted into the frame reception portion 51 from above. Thus, the divided multipolar connector 80 is held so that the respective sub-connectors 82a to 82d are opposite to the detector body 53.

Guide shafts 56 for guiding and moving the detector body 53 are fixed between the frame reception portion 52 and the detector body 53. The guide shafts 56 penetrate the detector body 53, and coil springs 57 are fitted respectively on the guide shafts 56 between the frame reception portion 52 and the detector body 53. The coil springs 57 energize the detector 53 to move backward.

In the detector body 53, a hole 64 is formed in the surface opposite to the frame reception portion 52 so that the angular cylinder portion 83 of the divided multipolar connector 80 is can be inserted to this hole 64, and a set of detection pins 55 for each of the sub-connectors 82a to 82d are formed so as to project from the same surface opposite to the frame reception portion 52.

As shown in FIGS. 2 (a) and (b), each of the detection pins 55 has an energizing means, that is, a coaxially disposed coil spring 62, and a switch means 63 constituted by an electrode divided into a pair of electrode parts not shown in detail. Each detection pin 55 is normally pushed forward by the coil spring 62 so that the detection pin 55 outputs an electric signal if the pair of electrode parts come into contact with each other when the detection pin 55 is pushed so as to move backward against the energizing force of the coil spring 62.

Further, the detection pins 55 project toward symmetrical positions with respect to the center of the front surface of each sub-connector 82 as shown by the dotted circles in FIG. 3. That is, the detection pins 55 are aligned along the arrangement of the engagement projections 5 and the lances 6.

The detector body 53 is provided so as to be movable forward/backward relative to the frame reception portion 52 in response to the rotation of the operating lever 54.

The operating lever 54 is constituted by: a pair of cam plates 59 which are pivotally supported by a pair of pivots 58 respectively provided on the opposite side plates of the bed 51 at its rear side; a handle 60 which couples the pair of cam plates 59 with each other at their one-end sides respectively; and links 61 which are pivotally attached at one end to the cam plates 59. The other ends of the respective links 61 are pivotally attached to the opposite side surfaces of the detector body 53. When the operating lever 54 is rotated forward as shown by the arrow α, the cam plates 59 rotate on the pivot 58 to thereby move the detector body 53 forward. When the operating lever 54 is rotated backward against the arrow α, on the contrary, the detector body 53 is moved backward by means of the rotation of the operating lever 54 as well as the action of the coil spring 57.

When the detector body 53 returns to its initial position, the edges of the links 61 collide against the inclined edges of the bed 51 respectively so that the detector body 53 is restrained from further retreating.

Next, the inspection of the installation of sub-connectors performed with the connector insertion inspection jig having such a configuration will be described.

The installation of the divided multipolar connector 80 is inspected when the respective sub-connectors 82a to 82d have been fitted into the frame 81.

The divided multipolar connector 80 is fitted into the frame reception portion 52 from above so that the frame 81 is held in the frame reception portion 52. After the divided multipolar connector 80 is brought into such a hold state, the operating lever 54 is rotated in the direction of the arrow α to move the detector body 53 forward so that the detection pins 55 collide against the front surfaces of the respective sub-connectors 82a to 82d in predetermined positions. FIGS. 2 (*a*) and (*b*) show the state at this time, in which the detection pins 55 can elastically contact with the two sub-connectors 82a and 82b respectively. While the sub-connector 82a shown in the upper of the drawing is put into a normal fitting state, the sub-connector 82b shown in the lower is brought into an imperfect fitting state where one of the engagement projections 5 does not engage with the lances 6 (refer to FIG. 3) of the frame 81.

Figure 6:
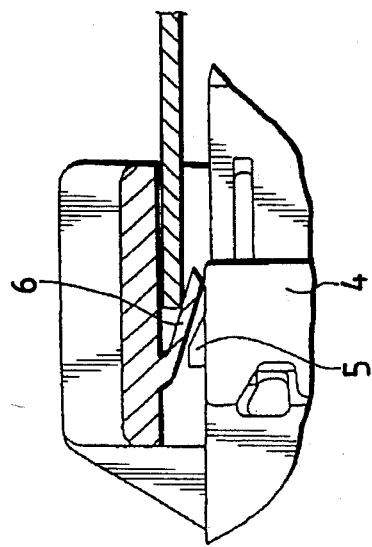
FIG. 6 is a diagram for explaining a first embodiment of the present invention, showing the installation state of sub-connectors.

Of the two sub-connectors 82a and 82b, with respect to the sub-connector 82a which has been fitted normally, both the pair of detection pins 55 elastically contact with the connector front surfaces so that both the pair of switch means 63 output electric signals. Accordingly, the state of normally fitting can be detected. On the other hand, with respect to the sub-connector 82b which has been fitted imperfectly, a difference of size indicated by $t$ in the drawing occurs so that the detection pin 55 on one side (the lower one in FIGS. 2 (*a*) and (*b*)) is not pushed by the connector front surface so that the switch means 63 associated therewith (the lower one in the drawing) does not output an electric signal. Accordingly, such a state of imperfect fitting, for example in the sub-connector 82b in FIGS. 2 (*a*) and (*b*), can be detected. In the case of quite imperfect fitting shown in the conventional example in FIG. 6, both the detection pins 55 are not pushed, so that no electric signal is put out from both the pair switch means 63. Accordingly, this state of quite imperfect state can be also detected perfectly.

Although the above embodiment is based on digital judgement as to whether electric signals are outputted or not, it can be based on the judgement where the difference between quantities of the pair of detection pins pushed is analyzed in an analog manner.

Further, in the above embodiment, description has been made about a case where a set of detection pins are arranged for each sub-connector in a symmetrical position with respect to a center of the front surface of the sub-connector and along the lock portion between the sub-connector and the frame. However, the present invention is not always limited to such a configuration.

As has been described, in the connector insertion inspection jig according to the present invention, at least a set of detection pins are disposed for one sub-connector symmetrically so as to contact with upper and lower positions or left and right positions of the front surface of the sub-connector. Accordingly, imperfect fitting caused by oblique installation or the like of the sub-connector into a frame can be detected perfectly.

Since the inspection pins electrically detect the state of fitting of the sub-connector by means of contacting the sub-connector elastically, any fitting trouble in any shape of divided multipolar connectors can be detected well.

What is claimed is:

1. A connector insertion inspection jig comprising:

a frame reception portion formed at one end portion of a base so as to fixedly hold a frame of a divided multipolar connector having sub-connectors;

a detector body facing said frame reception portion so as to be movable forward/backward on said base by means of rotation of an operating layer;

detection pins disposed on said detector body and facing said frame reception portion so as to be able to elastically contact with front surfaces of the sub-connectors engaged with said frame when said detector body is moved forward, wherein at least a set of said detection pins are provided for each of said sub-connectors, said detector pins projecting toward the front surfaces of said sub-connector and being separated from each other;

detection means for indicating that said sub-connectors are properly fitted with said divided multipolar connector when each detector pin in the set of detection pins contacts the front surface of the sub-connectors.

2. A connector insertion inspection jig according to claim 1, wherein said detection means comprises;

spring means disposed between said frame reception portion and said detector body for forwardly urging said detection pins; and switch means for outputting an electric signal when the detection pin is moved backward against the spring means, wherein said switch means and spring means are coaxially provided with each of said detection pins.

3. A connector insertion inspection jig according to claim 1, wherein said detection pins are positioned such that they engage symmetric positions with respect to the centers of said front surfaces of said sub-connectors when said detector body is moved forward.

4. A connector insertion inspection jig according to claim 2, wherein said detection pins are positioned such that they engage symmetric positions with respect to the centers of said front surfaces of said sub-connectors when said detector body is moved forward.

5. A connector insertion inspection jig according to claim 3, wherein said detector pines are positioned such that they extend in an arrangement direction of engagement projections and lances provided oppositely on said sub-connectors.

6. A connector insertion inspection jig according to claim 4, wherein said detector pins are positioned such that they extend in an arrangement direction of engagement projections and lances provided oppositely on said sub-connectors.

* * * * *